(12) United States Patent
Sun et al.

(10) Patent No.: US 8,288,753 B2
(45) Date of Patent: Oct. 16, 2012

(54) PROGRAMMABLE RESISTIVE MEMORY CELL WITH OXIDE LAYER

(75) Inventors: Ming Sun, Eden Prairie, MN (US); Michael Xuefei Tang, Bloomington, MN (US); Insik Jin, Eagan, MN (US); Venkatram Venkatasamy, Edina, MN (US); Philip George Pitcher, Shakopee, MN (US); Nurul Amin, Woodbury, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/278,245

(22) Filed: Oct. 21, 2011

(65) Prior Publication Data
US 2012/0032131 A1     Feb. 9, 2012

Related U.S. Application Data

(63) Continuation of application No. 12/390,711, filed on Feb. 23, 2009, now Pat. No. 8,058,646.

(60) Provisional application No. 61/109,198, filed on Oct. 29, 2008.

(51) Int. Cl.
*H01L 47/02* (2006.01)

(52) U.S. Cl. ................... 257/5; 257/3; 257/40

(58) Field of Classification Search ............ 257/40, 257/43, 415, E21.001, E29.068, 3, 540
See application file for complete search history.

(56) References Cited

U.S. PATENT DOCUMENTS

| | | | |
|---|---|---|---|
| 5,761,115 A | 6/1998 | Kozicki | |
| 6,864,415 B2 | 3/2005 | Koyanagi | |
| 7,118,936 B2 | 10/2006 | Kobayashi | |
| 7,169,635 B2* | 1/2007 | Kozicki | 438/95 |
| 8,097,902 B2* | 1/2012 | Xi et al. | 257/154 |
| 2002/0054462 A1 | 5/2002 | Sun | |
| 2003/0194865 A1 | 10/2003 | Gilton | |
| 2005/0274942 A1 | 12/2005 | Kozicki | |
| 2008/0043515 A1 | 2/2008 | Bloch | |

OTHER PUBLICATIONS

K. Prabhakaran et al., Distinctly Different Thermal Decomposition Pathways of Ultrathin Oxide Layer on Ge and Si Surfaces, Applied Physics Letters, Apr. 17, 2000.

* cited by examiner

*Primary Examiner* — Phuc Dang
(74) *Attorney, Agent, or Firm* — Mueting, Raasch & Gebhardt PA

(57) ABSTRACT

Programmable metallization memory cells include an electrochemically active electrode and an inert electrode and an ion conductor solid electrolyte material between the electrochemically active electrode and the inert electrode. An electrically insulating oxide layer separates the ion conductor solid electrolyte material from the electrochemically active electrode.

14 Claims, 4 Drawing Sheets

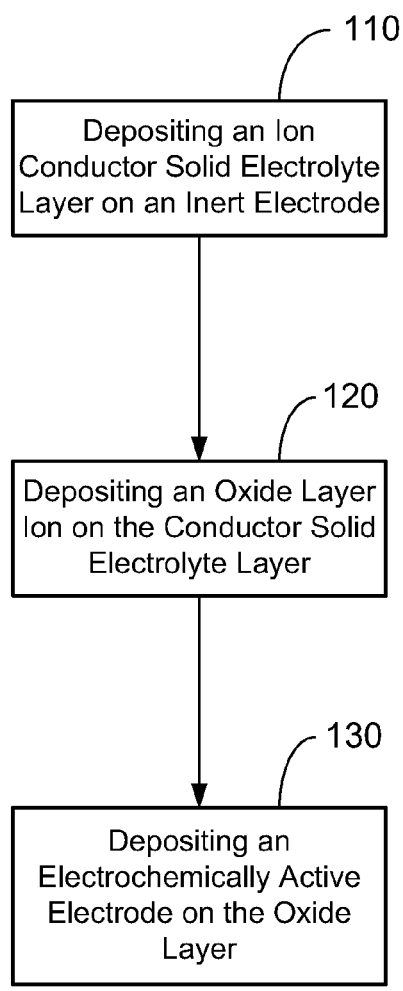
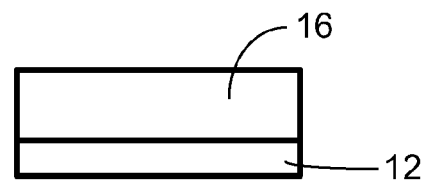
FIG. 5A
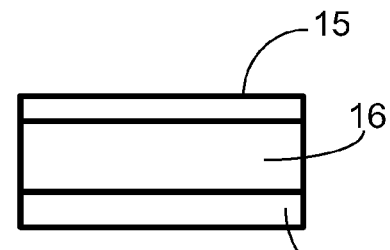
FIG. 5B
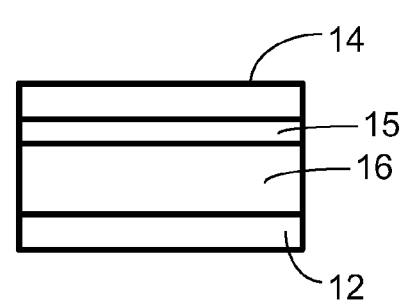
FIG. 5C
FIG. 4

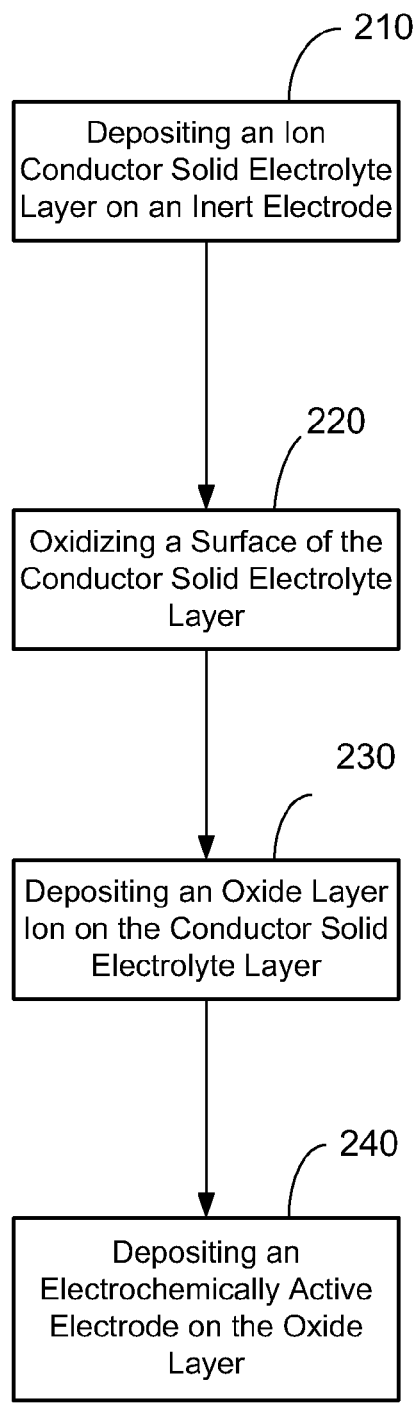
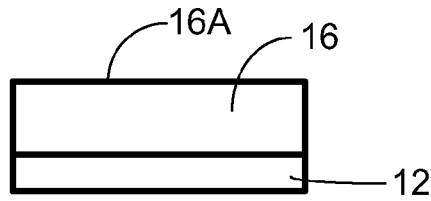
FIG. 7A
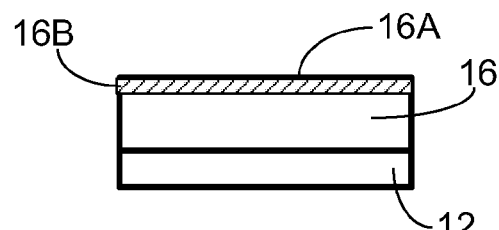
FIG. 7B
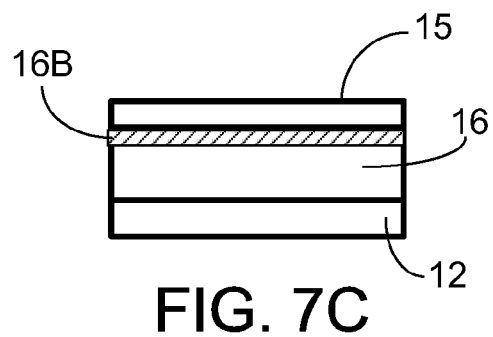
FIG. 7C
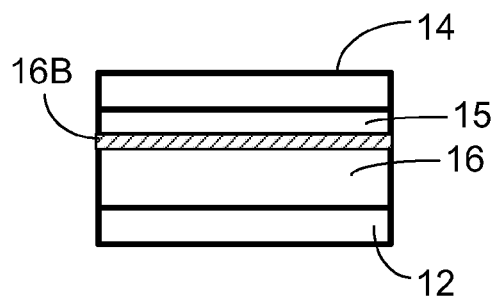
FIG. 7D
FIG. 6

PROGRAMMABLE RESISTIVE MEMORY CELL WITH OXIDE LAYER

CROSS-REFERENCE TO RELATED APPLICATIONS

This application is a continuation application of U.S. patent application Ser. No. 12/390,711 filed Feb. 23, 2009, which claims the benefit of U.S. Provisional Application No. 61/109,198 filed Oct. 29, 2008, the contents of both are hereby incorporated by reference in their entirety.

BACKGROUND

Memory devices are common in electronic systems and computers to store data. These memory devices may be volatile memory, where the stored data is lost if the power source is disconnected or removed, or non-volatile, where the stored data is retained even during power interruption. An example of a non-volatile memory device is a programmable metallization cell (PMC).

A PMC utilizes a fast ion conductor such as a chalcogenide-type or an oxide-type (e.g., NiO) and at least two electrodes (e.g., an anode and a cathode) with the fast ion conductor between the electrodes. When a voltage is applied across the electrodes, superionic clusters or conducting filaments rapidly grow from the cathode through the fast ion conductor towards the anode. When the clusters or filaments are present, the cell is in a low resistance state. When an electric field of opposite polarity is applied across the electrodes, the conducting filaments dissolve and the conducing paths are disrupted, providing the cell with a high resistance state. The two resistance states are switchable by the application of the appropriate electric field and are used to store the memory data bit of "1" or "0".

While a high ionic conductive solid electrolyte (e.g., chalcogenide) provides a high speed switch between the two resistance states of the PMC, this material can suffer from poor data state retention. Another lower ionic conductive solid electrolyte (e.g., oxide electrolyte) provides for good data state retention, but this material can suffer from slow switching between the two resistance states of the PMC. Thus, there is a tradeoff between switching speed and data retention in a PMC cell depending on what solid electrolyte (in regards to the material property differences) is provided in the PMC cell. There is a need for a PMC cell that can provide both fast switching speeds and extended data retention.

BRIEF SUMMARY

The present disclosure relates to programmable metallization memory cells having an oxide layer separating the solid electrolyte from the electrochemically active electrode of the programmable metallization memory cell.

In one illustrative embodiment, a programmable metallization memory cell includes an electrochemically active electrode and an inert electrode and an ion conductor solid electrolyte material between the electrochemically active electrode and the inert electrode. An electrically insulating oxide layer separates the ion conductor solid electrolyte material from the electrochemically active electrode.

One illustrative method of forming a programmable metallization memory cell includes depositing an ion conductor solid electrolyte layer on an inert electrode, depositing an oxide forming layer on the ion conductor solid electrolyte layer, and depositing an electrochemically active electrode on the oxide forming layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 4 is a flow diagram of an illustrative method of forming a programmable metallization memory cell with an oxide layer;

FIGS. 5A-5C are schematic cross-section views of a programmable metallization memory cell with oxide layer at various stages of manufacture;

FIG. 6 is a flow diagram of another illustrative method of forming a programmable metallization memory cell with an oxide layer; and FIGS. 7A-7D are schematic cross-section views of another programmable metallization memory cell with oxide layer at various stages of manufacture.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
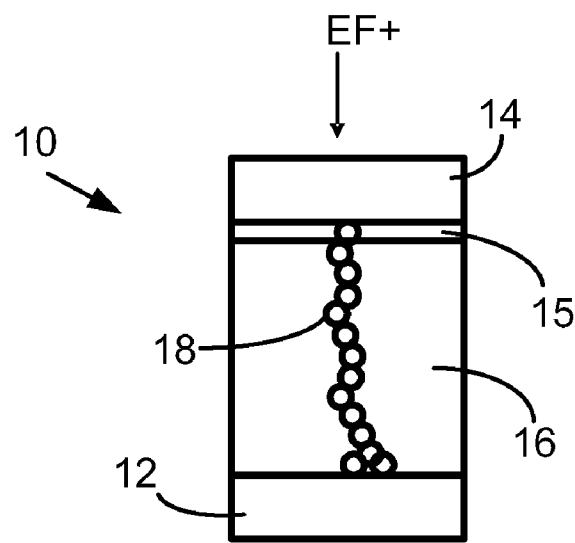
FIG. 1A is a schematic side view diagram of an illustrative programmable metallization memory cell in a low resistance state.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

The present disclosure relates to programmable metallization memory cells having an oxide layer separating the solid electrolyte from the electrochemically active electrode of the programmable metallization memory cell. The oxide layer serves as an ionic barrier layer that hinders or prevents ionic transport between the solid electrolyte and the electrochemically active electrode of the programmable metallization memory cell when an electrical bias is removed from the programmable metallization memory cell. The oxide layer can be grown when an electrical bias is removed from the programmable metallization memory cell, and the oxide layer can be converted to a more ionic conductive phase when a negative electrical bias is applied to the programmable metallization memory cell. Overall, the oxide layer serves as a barrier to ionic transport between the solid electrolyte and the electrochemically active electrode of the programmable metallization memory cell, which enhances cell data state retention. While the present disclosure is not so limited, an appreciation of various aspects of the disclosure will be gained through a discussion of the examples provided below.

Figure 1B:
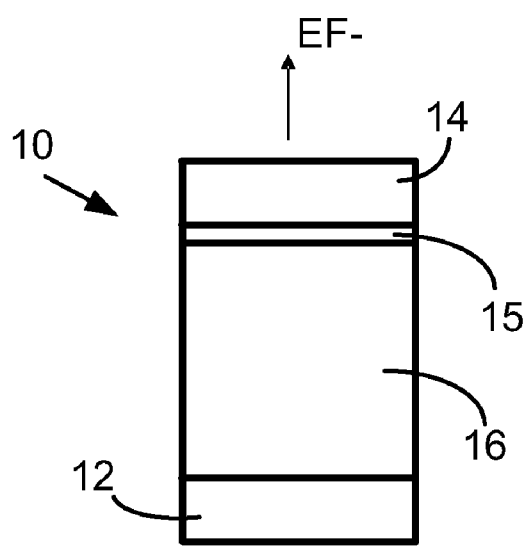
FIG. 1B is schematic side view diagram of the illustrative programmable metallization memory cell in a high resistance state.

FIGS. 1A and 1B are cross-sectional schematic diagrams of an illustrative programmable metallization memory cell 10. In FIG. 1A, memory cell 10 is in the low resistance state. In FIG. 1B, cell 10 is in the high resistance state. Programmable metallization cell (PMC) memory is based on the physical re-location of superionic regions and forming conducting filaments within an ion conductor solid electrolyte material 16. Memory cell 10 includes an electrochemically inert electrode 12, an electrochemically active electrode 14, an ion conductor solid electrolyte material 16, and an electrically insulating oxide layer 15 separates the ion conductor solid electrolyte material 16 from the electrochemically active electrode 14. The ion conductor solid electrolyte material 16 is between the electrochemically inert electrode 12 and the electrochemically active electrode 14.

The electrochemically active electrode 14 can be formed of any useful electrochemically active material such as, silver (Ag) or copper (Cu). The active electrode 14 can have any useful thickness, for example, from 50 Angstroms to 5000 Angstroms. A top electrode (not shown) can be disposed on the electrochemically active electrode 14. The top electrode can be formed of any useful electrochemically inert metallic material, as described below.

The inert electrode 12 can be formed of any useful electrochemically inert metallic material. In many embodiments, the inert electrode 12 is formed of electrochemically inert metal such as, tungsten (W), nickel (Ni), molybdenum (Mo), platinum (Pt), gold (Au), palladium (Pd), and rhodium (Rh) for example. In some embodiments the inert electrode 12 has two or more metal layers, where the metal layer closest to the ion conductor solid electrolyte material 16 is electrochemically inert while additional layers can be electrochemically active. The inert electrode 12 can also be referred to as a bottom electrode. The inert electrode 12 can be, but need not be formed on a substrate. The substrate, if utilized, can include silicon, a mixture of silicon and germanium, and other similar materials. FIG. 1A and FIG. 1B does not depict an optional substrate.

The ion conductor solid electrolyte material 16 can be formed of any useful material that provides for the formation of conducting filaments 18 within the ion conductor solid electrolyte material and extend between the electrochemically active electrode 14 and the inert metal contact 12 upon application of an electric field EF+. In many embodiments the ion conductor solid electrolyte material 16 is a chalcogenide-type material such as, for example, $GeS_2$, $GeSe_2$, $CuS_2$, CuTe, and the like. In other embodiments the ion conductor solid electrolyte material 16 is an oxide-type material such as, for example, $WO_3$, $SiO_2$, $Gd_2O_3$ and the like.

Application of an electric field EF+ across the electrochemically active electrode 14 and the inert metal contact 12 allow metal cations (i.e., silver ions) to migrate toward the inert metal contact 12, electrically connecting the inert metal contact 12 to the electrochemically active electrode 14. This electrical connection gives rise to the low resistance state of the programmable metallization memory cell 10.

Reading the PMC 10 simply requires a small voltage applied across the cell. If the conducting filaments 18 electrically connect the inert metal contact 12 to the electrochemically active electrode 14, the resistance will be low, leading to higher current, which can be read as a "1". If conducting filaments 18 do not electrically connect the inert metal contact 12 to the electrochemically active electrode 18, the resistance is higher, leading to low current, which can be read as a "0" as illustrated in FIG. 1B.

FIG. 1B is schematic diagram of an illustrative programmable metallization memory cell 10 in a high resistance state. Application of an electric field of opposite polarity FE− ionizes the conducting filaments 18 and dissolves ions from the electrically conducting filaments 18 back to the electrochemically active electrode 14, breaking the electrical connection between the inert metal contact 12 to the electrochemically active electrode 14 and gives rise to the high resistance state of the programmable metallization memory cell 10. The low resistance state and the high resistance state are switchable with an applied electric field and are used to store the memory bit "1" and "0".

Figure 2:
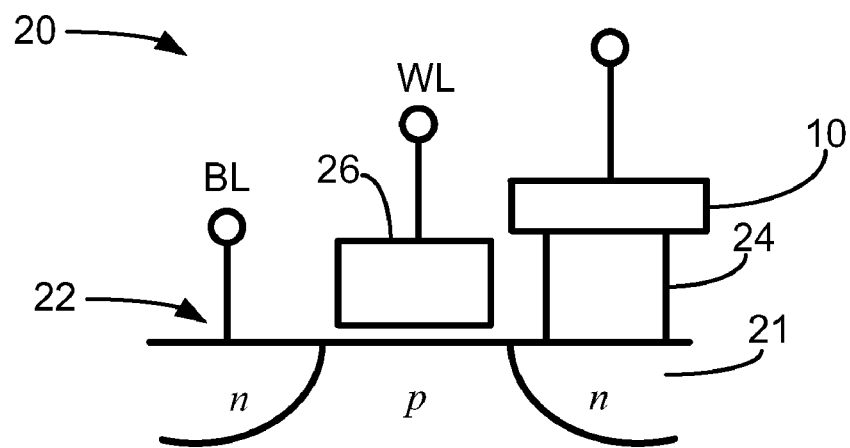
FIG. 2 is a schematic diagram of an illustrative programmable metallization memory unit including a semiconductor transistor.

FIG. 2 is a schematic diagram of an illustrative programmable metallization memory unit 20 including a semiconductor transistor 22. Memory unit 20 includes a programmable metallization memory cell 10, as described herein, electrically coupled to semiconductor transistor 22 via an electrically conducting element 24. Transistor 22 includes a semiconductor substrate 21 having doped regions (e.g., illustrated as n-doped regions) and a channel region (e.g., illustrated as a p-doped channel region) between the doped regions. Transistor 22 includes a gate 26 that is electrically coupled to a word line WL to allow selection and current to flow from a bit line BL to memory cell 10. An array of programmable metallization memory units 20 can be formed on a semiconductor substrate utilizing semiconductor fabrication techniques.

Figure 3:
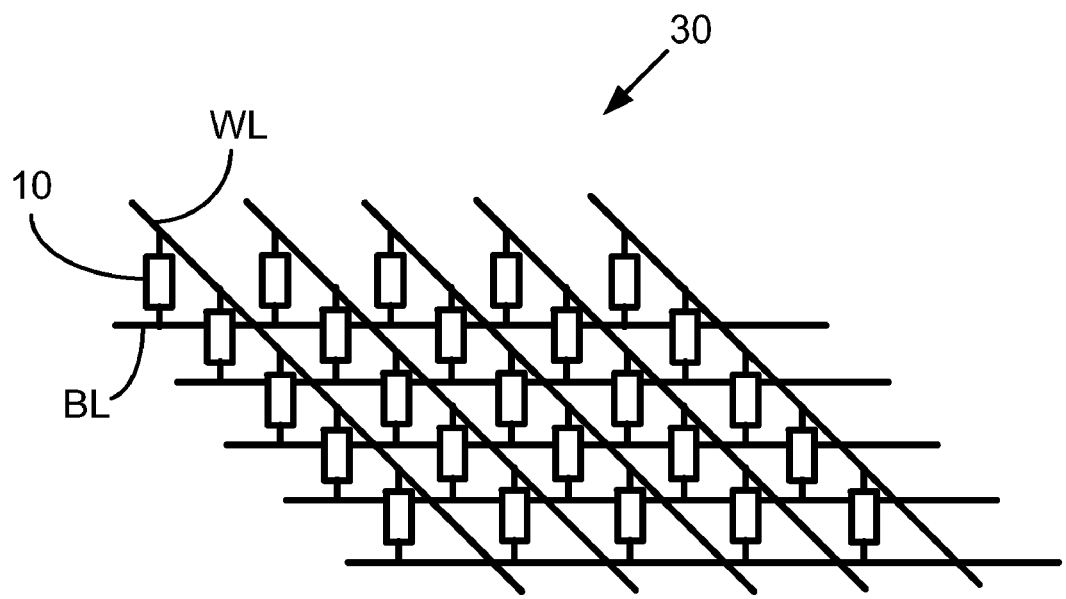
FIG. 3 is a schematic diagram of an illustrative programmable metallization memory array.

FIG. 3 is a schematic diagram of an illustrative programmable metallization memory array 30. Memory array 30 includes a plurality of word lines WL and a plurality of bit lines BL forming a cross-point array. At each cross-point a programmable metallization memory cell 10, as described herein, is electrically coupled to word line WL and bit line BL. A select device (not shown) can be at each cross-point or at each word line WL and bit line BL.

FIG. 4 is a flow diagram of an illustrative method of forming a programmable metallization memory cell with an oxide layer. FIGS. 5A-5C are schematic cross-section views of a programmable metallization memory cell with an oxide layer at various stages of manufacture.

At FIG. 5A an ion conductor solid electrolyte layer 16 is deposited on an inert electrode 12 at block 110 of FIG. 4. Both the ion conductor solid electrolyte layer 16 and the inert electrode 12 can be formed using known deposition methods such as physical vapor deposition, chemical vapor deposition, electrochemical deposition, molecular beam epitaxy and atomic layer deposition. While not illustrated, the inert electrode 12 can be deposited on a substrate. The substrate includes, but is not limited to silicon, a mixture of silicon and germanium, and other similar material.

At FIG. 5B an oxide layer 15 or oxide forming layer 15 is deposited on the ion conductor solid electrolyte layer 16 at block 120 of FIG. 4. The oxide layer 15 or oxide forming layer 15 can be formed using known deposition methods, as described above. The oxide layer 15 or oxide forming layer 15 has a thickness in a range from 0.5 to 10 nanometers or from 1 to 5 nanometers. The oxide layer 15 can be formed of any useful electrically insulating oxide material such as, silicon (Si) oxide, aluminum (Al) oxide, titanium (Ti) oxide, halfnium (Hf) oxide, gadolinium (Gd) oxide or other transition metal oxide. The oxide forming layer 15 can be formed of any material that have a very negative standard reduction potential so that the material can form an oxide material when oxygen ions are present, such as, silicon (Si), aluminum (Al), and halfnium (Hf). Thus, the oxide forming layer 15 can combine with oxygen ions to form an oxide layer 15.

At FIG. 5C an electrochemically active electrode 14 is deposited on the oxide layer 15 or oxide forming layer 15 at block 130 of FIG. 4. The electrochemically active electrode 14 can be formed using known deposition methods, as described above. Additional metal contact layer(s) can be formed on the electrochemically active electrode 14. In many embodiments, at least one inert metal contact layer is deposited on the electrochemically active electrode 14 (not shown).

FIG. 6 is a flow diagram of another illustrative method of forming a programmable metallization memory cell with an oxide layer. FIGS. 7A-7D are schematic cross-section views of another programmable metallization memory cell with oxide layer at various stages of manufacture.

At FIG. 7A an ion conductor solid electrolyte layer 16 is deposited on an inert electrode 12 at block 210 of FIG. 6. The ion conductor solid electrolyte layer 16 has a surface 16A or an exposed surface 16A. Both the ion conductor solid electrolyte layer 16 and the inert electrode 12 can be formed using known deposition methods such as physical vapor deposition, chemical vapor deposition, electrochemical deposition, molecular beam epitaxy and atomic layer deposition. While not illustrated, the inert electrode 12 can be deposited on a substrate. The substrate includes, but is not limited to silicon, a mixture of silicon and germanium, and other similar material.

At FIG. 7B the surface 16A of the ion conductor solid electrolyte layer 16 is oxidized to form an oxidized surface 16B at block 220 of FIG. 6. The surface 16A of the ion conductor solid electrolyte layer 16 can be oxidized utilizing any useful oxidation technique such as thermal oxidation, plasma oxidation, or UV oxidation, for example. In many embodiments the ion conductor solid electrolyte material 16 is a chalcogenide-type material such as a germanium rich solid (e.g., $GeS_2$) electrolyte, for example. In this example, the oxidized surface 16B will include germanium oxide.

FIG. 7C illustrates an oxide layer 15 or oxide forming layer 15 deposited on the ion conductor solid electrolyte layer 16 at block 230 of FIG. 6. The oxide layer 15 or oxide forming layer 15 can be formed using known deposition methods, as described above. The oxide layer 15 or oxide forming layer 15 has a thickness in a range from 0.1 to 10 nanometers or from 1 to 5 nanometers. The oxide layer 15 can be formed of any useful electrically insulating oxide material such as, silicon (Si) oxide, aluminum (Al) oxide, titanium (Ti) oxide, halfnium (Hf) oxide, gadolinium (Gd) oxide or other transition metal oxide. The oxide forming layer 15 can be formed of any material that have a very negative standard reduction potential so that the material can form an oxide material when oxygen ions are present, such as, silicon (Si), aluminum (Al), and halfnium (Hf). Thus, the oxide forming layer 15 can combine with oxygen ions to form an oxide layer 15. In many embodiments the oxide forming layer 15 combines with oxygen ions from the oxidized surface 16B of the ion conductor solid electrolyte layer 16 (e.g., the germanium oxide described above).

FIG. 7D illustrates an electrochemically active electrode 14 deposited on the oxide layer 15 or oxide forming layer 15 at block 240 of FIG. 6. The electrochemically active electrode 14 can be formed using known deposition methods, as described above. Additional metal contact layer(s) can be formed on the electrochemically active electrode 14. In many embodiments, at least one inert metal contact layer is deposited on the electrochemically active electrode 14 (not shown).

The oxide layer 15 described herein serves as an ionic barrier layer that hinders or prevents ionic transport between the solid electrolyte 16 and the electrochemically active electrode 14 of the programmable metallization memory cell when an electrical bias is not present on the programmable metallization memory cell. For example, in the absence of an electrical bias across the programmable metallization memory cell, oxygen ions migrate from the solid electrolyte 16 to the oxide layer 15 increasing the ionic barrier properties of the oxide layer 15 and therefore increasing the data state retention property of the programmable metallization memory cell.

The oxide layer 15 can be converted to a more ionic conductive phase when a negative electrical bias is applied to the programmable metallization memory cell. Thus during a reset operation on the programmable metallization memory cell oxygen ions can migrate from the oxide layer 15 to the solid electrolyte 16 decreasing the ionic barrier properties of the oxide layer 15. Overall, the oxide layer 15 serves as a variable barrier to ionic transport between the solid electrolyte and the electrochemically active electrode of the programmable metallization memory cell (depending on an applied electrical bias), which enhances cell data state retention.

Thus, embodiments of the PROGRAMMABLE RESISTIVE MEMORY CELL WITH OXIDE LAYER are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A memory cell comprising:
   an electrochemically active electrode and an inert electrode;
   an ion conductor solid electrolyte material between the electrochemically active electrode and the inert electrode, the ion conductor solid electrolyte material forms conducting filaments within the ion conductor solid electrolyte material that extend between the electrochemically active electrode and the inert electrode upon application of an electric field; and
   an electrically insulating oxide layer separating the ion conductor solid electrolyte material from the electrochemically active electrode.

2. The memory cell of claim 1 wherein the electrically insulating oxide layer has a thickness in a range from 1 to 5 nanometers.

3. The memory cell of claim 1 wherein the electrically insulating oxide layer comprises a metal oxide.

4. The memory cell of claim 1 wherein the electrically insulating oxide layer comprises Si.

5. The memory cell of claim 1 wherein the ion conductor solid electrolyte material comprises a chalcogenide material.

6. The memory cell of claim 1 further comprising a layer of germanium oxide separating the electrically insulating oxide layer and the ion conductor solid electrolyte material.

7. The memory cell of claim 6 wherein the electrically insulating oxide layer comprises Si, Al, or Hf.

8. A memory cell comprising:
   an electrochemically active electrode and an inert electrode;
   an ion conductor solid electrolyte material between the electrochemically active electrode and the inert electrode, the ion conductor solid electrolyte material forms conducting filaments within the ion conductor solid electrolyte material that extend between the electrochemically active electrode and the inert electrode upon application of an electric field, the ion conductor solid electrolyte material having an oxidized surface;
   an oxide layer separating the oxidized surface of the ion conductor solid electrolyte material from the electrochemically active electrode.

9. The memory cell of claim 8 wherein the oxide layer has a thickness in a range from 1 to 5 nanometers.

10. The memory cell of claim 8 wherein the ion conductor solid electrolyte material comprises a chalcogenide material.

11. The memory cell of claim 8 wherein the oxidized surface comprises germanium oxide.

12. The memory cell of claim 8 wherein the oxide layer comprises an oxide of Si, Al, or Hf.

13. The memory cell of claim 8 wherein the oxide layer comprises a metal oxide.

14. The memory cell of claim 8 wherein the oxide layer comprises Si.

* * * * *